(12) United States Patent
Nishigawa et al.

(10) Patent No.: US 7,578,053 B2
(45) Date of Patent: Aug. 25, 2009

(54) INTERPOSER BONDING DEVICE

(75) Inventors: Ryoichi Nishigawa, Akashi (JP); Hiroshi Aoyama, Akashi (JP)

(73) Assignee: Hallys Corporation, Akashi-shi (JP)

( * ) Notice: Subject to any disclaimer, the term of this patent is extended or adjusted under 35 U.S.C. 154(b) by 0 days.

(21) Appl. No.: 11/720,756

(22) PCT Filed: Dec. 3, 2005

(86) PCT No.: PCT/JP2005/022220

§ 371 (c)(1), (2), (4) Date: Jun. 3, 2007

(87) PCT Pub. No.: WO2006/059732

PCT Pub. Date: Jun. 8, 2006

(65) Prior Publication Data

US 2008/0053617 A1    Mar. 6, 2008

(30) Foreign Application Priority Data

Dec. 3, 2004  (JP) ............................. 2004-350841
Dec. 3, 2004  (JP) ............................. 2004-351258

(51) Int. Cl.
*B23P 19/00* (2006.01)
(52) U.S. Cl. ............................. 29/739; 29/740; 29/741; 29/742; 29/832; 228/180.21; 156/285
(58) Field of Classification Search ................... 29/739, 29/740–743, 832–834, 600, 601; 156/285, 156/379.6, 381, 382; 219/243; 228/180.21, 228/180.22, 1.1, 4.5, 6.2, 19, 44.7, 200, 264, 228/825; 294/64.1; 414/737, 752.1, 941
See application file for complete search history.

(56) References Cited

U.S. PATENT DOCUMENTS 4,558,397 A    12/1985    Olsson (Continued)

FOREIGN PATENT DOCUMENTS

DE    19805031    8/1999

(Continued)

OTHER PUBLICATIONS

Kuwahara, Yoshiko, "International Preliminary Report on Patentability and Written Opinion of the International Searching Authority" for International Patent Application PCT/JP2005/022220 (report issued Jun. 5, 2007), The International Bureau of the World Intellectual Property Organization.

*Primary Examiner*—Minh Trinh
(74) *Attorney, Agent, or Firm*—Westerman, Hattori, Daniels & Adrian, LLP.

(57) ABSTRACT

An interposer bonding device 3 is intended for bonding an interposer 10 having an interposer-side terminal to a base circuit sheet 20 provided with a base-side terminal. The interposer bonding device 3 has a press anvil 31 that holds the base circuit sheet 20 on which the interposer 10 is laminated and a bonding head 32 that moves relatively with respect to the press anvil 31. The bonding head 32 has a pressing surface 320 that presses the rear surface of the interposer by abutting against this surface. The pressing surface 320 scans the rear surface of the interposer 10 by the relative movement of the bonding head 32 with respect to the press anvil 31 and presses the whole surface of the interposer-side terminal 12 toward the base circuit sheet 20.

10 Claims, 13 Drawing Sheets

U.S. PATENT DOCUMENTS

| | | | |
|---|---|---|---|
| 4,619,043 A | 10/1986 | Taguchi | |
| 4,656,478 A | 4/1987 | Leuenberger | |
| 4,746,618 A | 5/1988 | Nath | |
| 4,915,565 A | 4/1990 | Bond | |
| 5,078,375 A | 1/1992 | Steidinger | |
| 5,235,736 A | 8/1993 | Hahs | |
| 5,342,460 A * | 8/1994 | Hidese | 156/64 |
| 5,591,298 A * | 1/1997 | Goodman et al. | 156/580.1 |
| 5,615,476 A | 4/1997 | Bottge | |
| 5,690,773 A | 11/1997 | Fidalgo | |
| 5,751,256 A | 5/1998 | Pennace | |
| 5,825,291 A | 10/1998 | Platt | |
| 5,826,328 A | 10/1998 | Brady | |
| 5,864,943 A * | 2/1999 | Arakawa et al. | 29/740 |
| 5,915,462 A * | 6/1999 | Hernandez et al. | 165/47 |
| 5,946,791 A | 9/1999 | Baldwin | |
| 5,966,903 A | 10/1999 | Dudderar | |
| 5,972,156 A | 10/1999 | Brady et al. | |
| 5,973,600 A | 10/1999 | Mosher | |
| 6,018,299 A | 1/2000 | Eberhardt | |
| 6,078,259 A | 6/2000 | Brady | |
| 6,100,804 A | 8/2000 | Brady et al. | |
| 6,140,146 A | 10/2000 | Brady et al. | |
| 6,215,401 B1 | 4/2001 | Brady et al. | |
| 6,219,911 B1 | 4/2001 | Estes | |
| 6,259,408 B1 | 7/2001 | Brady et al. | |
| 6,369,711 B1 | 4/2002 | Adams | |
| 6,394,346 B1 | 5/2002 | Bonneau | |
| 6,410,415 B1 | 6/2002 | Estes | |
| 6,445,977 B1 | 9/2002 | Hwang | |
| 6,456,228 B1 | 9/2002 | Granhed | |
| 6,479,777 B2 | 11/2002 | Yamakawa | |
| 6,492,717 B1 | 12/2002 | Gore | |
| 6,523,734 B1 | 2/2003 | Kawai et al. | |
| 6,525,410 B1 | 2/2003 | Gelsomini | |
| 6,570,490 B1 | 5/2003 | Saitoh | |
| 6,581,817 B2 * | 6/2003 | Kawashima et al. | 228/6.2 |
| 6,667,192 B1 | 12/2003 | Patrice | |
| 6,745,945 B1 | 6/2004 | Limelette | |
| 6,779,733 B2 | 8/2004 | Akita | |
| 6,891,110 B1 | 5/2005 | Pennaz | |
| 6,957,481 B1 | 10/2005 | Patrice | |
| 6,972,394 B2 | 12/2005 | Brod | |
| 7,014,729 B2 | 3/2006 | Grabau | |
| 7,185,420 B2 * | 3/2007 | Mayer | 29/739 |
| 2001/0012682 A1 | 8/2001 | Kayanakis | |
| 2003/0070289 A1 | 4/2003 | Hwang | |
| 2003/0136503 A1 | 7/2003 | Green | |
| 2004/0088855 A1 | 5/2004 | Alram | |
| 2004/0125040 A1 | 7/2004 | Ferguson et al. | |
| 2004/0168310 A1 | 9/2004 | Takano | |
| 2004/0192011 A1 | 9/2004 | Roesner | |
| 2004/0194876 A1 | 10/2004 | Overmeyer | |
| 2005/0001785 A1 | 1/2005 | Ferguson et al. | |
| 2005/0035924 A1 | 2/2005 | Liu | |
| 2005/0155219 A1 | 7/2005 | Hwang | |
| 2005/0181530 A1 | 8/2005 | Brugger | |
| 2005/0252605 A1 | 11/2005 | Green | |

FOREIGN PATENT DOCUMENTS

| | | |
|---|---|---|
| DE | 10120269 | 7/2002 |
| DE | 19634473 | 6/2003 |
| DE | 19840226 | 2/2006 |
| EP | 534454 | 3/1993 |
| EP | 749270 | 12/1996 |
| EP | 902475 | 7/2000 |
| EP | 1352835 | 10/2003 |
| FR | 2775533 | 9/1999 |
| JP | 01-308097 | 12/1989 |
| JP | 02-098902 | 11/1990 |
| JP | 09-240176 | 9/1997 |
| JP | 10-050736 | 2/1998 |
| JP | 10-163252 | 6/1998 |
| JP | 11-282997 | 10/1999 |
| JP | 2000-227950 | 8/2000 |
| JP | 2000-244199 | 9/2000 |
| JP | 2001-135992 | 5/2001 |
| JP | 2002-007989 | 1/2002 |
| JP | 2002-298108 | 10/2002 |
| JP | 2002-298208 | 10/2002 |
| JP | 2003-168099 | 6/2003 |
| JP | 2003-281936 | 10/2003 |
| JP | 2003-283120 | 10/2003 |
| JP | 2003-283121 | 10/2003 |
| JP | 2003-288570 | 10/2003 |
| JP | 2004-038573 | 2/2004 |
| JP | 2004-179611 | 6/2004 |
| JP | 2004-180217 | 6/2004 |
| JP | 2004-220304 | 8/2004 |
| JP | 2004-265920 | 9/2004 |
| JP | 2004-265953 | 9/2004 |
| JP | 2005-286171 | 10/2005 |
| WO | 95/21423 A1 | 8/1995 |
| WO | 99/35691 A1 | 7/1999 |
| WO | 00/16285 | 3/2000 |
| WO | 00/64229 | 10/2000 |
| WO | 01/54058 | 7/2001 |
| WO | 01/61646 | 8/2001 |
| WO | 01/95241 | 12/2001 |
| WO | 02/37414 | 5/2002 |
| WO | 02/49093 | 6/2002 |
| WO | 02/082368 | 10/2002 |
| WO | 02/093625 | 11/2002 |
| WO | 03/007232 | 1/2003 |
| WO | 03/012734 | 2/2003 |
| WO | 03/022023 | 3/2003 |
| WO | 03/071476 | 8/2003 |
| WO | 03/107266 | 12/2003 |
| WO | 2004/012896 | 2/2004 |
| WO | 2004/046762 | 6/2004 |
| WO | 2004/088571 | 10/2004 |
| WO | 2005/096435 A1 | 10/2005 |
| WO | 2006/009934 A1 | 1/2006 |

* cited by examiner

INTERPOSER BONDING DEVICE

CROSS-REFERENCE TO RELATED APPLICATIONS

The benefit of priority is claimed to International Application PCT/JP05/22220, filed Dec. 3, 2005, the entire contents of which are incorporated by reference herein. The benefit of priority is further claimed to Japanese patent applications 2004-350841 and 2004-351258, both filed Dec. 3, 2004; and the entire contents of both Japanese applications are also incorporated herein by reference.

TECHNICAL FIELD

The present invention relates to an electronic component manufacturing apparatus for bonding an interposer on which a semiconductor chip is mounted to a base circuit sheet.

RELATED ART

For example, there have been available RF-ID media in which an interposer, in which an IC chip is mounted on a resin film, is laminated on an antenna sheet and bonded thereto. In fabricating such RF-ID media, an interposer may be laminated via an adhesive and an antenna sheet is pressed in the lamination direction thereof. Examples of an interposer bonding device for pressing and bonding an interposer and an antenna sheet like this include an interposer bonding device in which the interposer and the antenna sheet are arranged in a gap between a pair of press dies facing each other, after which the gap is gradually reduced to perform press and bonding (refer to Japanese Patent Laid-Open No. 2003-283120, for example, the entire contents of which are incorporated herein by reference).

However, the above-described conventional interposer boding device has a problem as given below. That is, in the above-described bonding device, it is necessary that a step for arranging a workproduct in the press dies, a step for press by use of the press dies, and a step for taking out the workproduct be performed in sequence, and this poses the problem that there is a fear that the production efficiency may not be sufficiently increased.

SUMMARY

The present invention has been made in view of the above-described conventional problem and is intended for providing an interposer bonding device with increased production efficiency.

The present invention provides an interposer bonding device for bonding an interposer to a base circuit sheet, the interposer having a semiconductor chip mounted on a sheet-like chip holding member and having an interposer-side terminal as a connection terminal extending from the semiconductor chip, the base circuit sheet formed from a sheet-like base member and provided with a base-side terminal on a surface thereof, the interposer bonding device including a press anvil that holds the base circuit sheet on which the interposer is laminated, with the interposer-side terminal and the base-side terminal facing each other; and a bonding head that can move relatively with respect to the press anvil, in which the bonding head has a pressing surface that can press a rear surface of the interposer or the base circuit sheet by abutting against the rear surface, the pressing surface being able to scan the rear surface of the interposer or the base circuit sheet according to the relative movement of the bonding head to the press anvil and to press the whole surface of the interposer-side terminal to the base circuit sheet.

The interposer bonding device of the present invention bonds the interposer and the base circuit sheet together by the relative movement between the bonding head and the press anvil. That is, this interposer bonding device positively uses the relative movement of the interposer and the base circuit sheet, which are held by the press anvil, with respect to the bonding head.

Because of this, in the interposer bonding device of the present invention, for example, it is possible to simultaneously perform a step of conveying a workproduct and supplying the workproduct to the bonding head and a step of pressing and bonding the interposer by use of the bonding head. In addition, it is possible to take out a worked electronic component while performing the step of pressing and bonding the interposer by use of the bonding head. For this reason, according to the interposer bonding device, it is possible to perform the working of the electronic component continuously and very efficiently.

DETAILED DESCRIPTION

Figure 1:
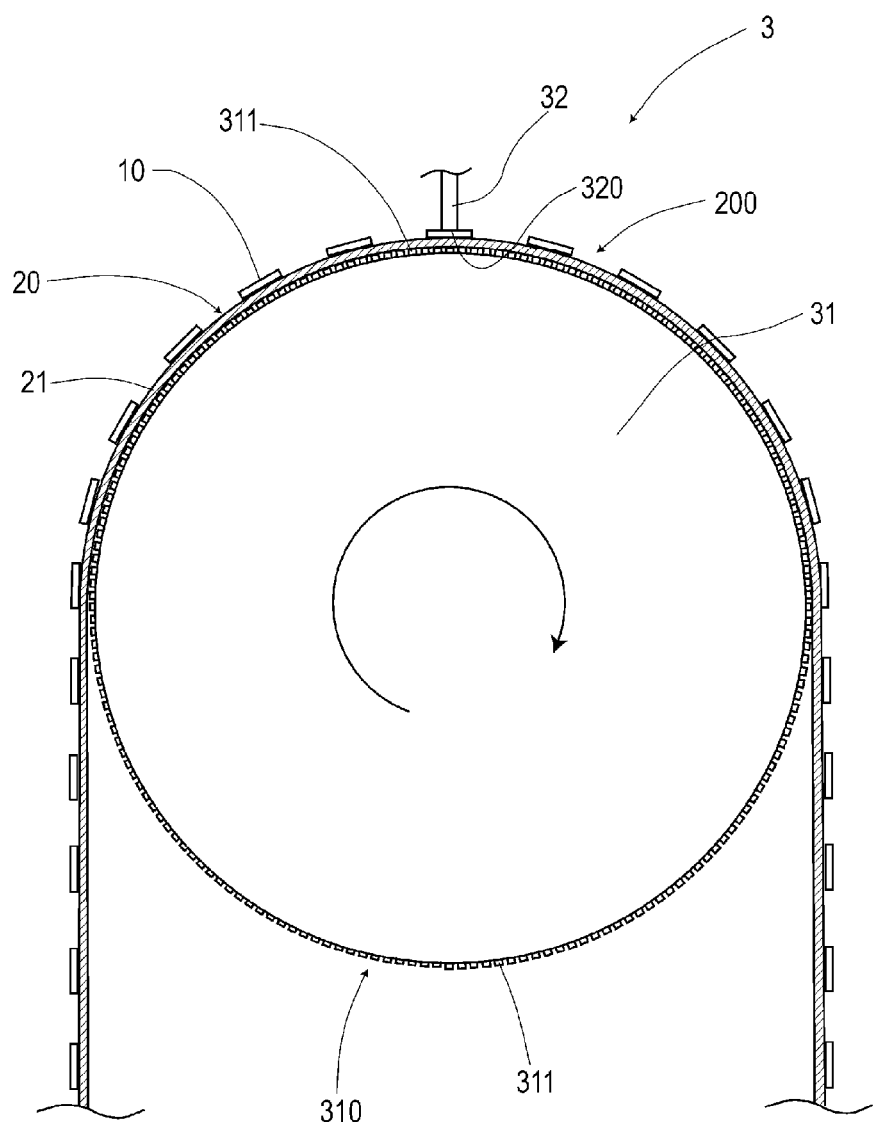
FIG. 1 is an explanatory diagram to explain the bonding step by an interposer bonding device in Embodiment 1.

In the present invention, the chip holding member and the base member can be formed from such materials as synthetic resins, for example, a PET film, PPS resins, PLA resins and general-purpose engineering plastics, paper, nonwoven fabrics, metal materials, for example, aluminum foil and copper foil, and glass. Incidentally, the material for the chip holding member and the material for the base member may be a combination of the same material or may be a combination of different materials.

It is preferred that the base member be formed from a plastic resin material and that the press anvil be provided with a convex portion including a protrusion that protrudes toward part of a rear surface region of the base-side terminal of the base circuit sheet.

In this case, part of the base-side terminal is easily protruded and deformed by the effect of the protrusion. And the leading end of the protrusion can be pressure bonded to the interposer-side terminal. Because of this, it is possible to realize electrical connection between the interposer and the base sheet circuit with high reliability and to thereby increase the durability of the electronic component.

Incidentally, materials such as PS, PC, PA, PP and PPE (PET) can be used as the plastic resin material.

It is preferred that the interposer and the base circuit sheet be bonded together with an adhesive disposed at least in a gap between the interposer-side terminal and the base-side terminal among gaps formed by the interposer and the base circuit sheet by facing each other, and that the adhesive be an insulating adhesive having electrical insulating properties.

In this case, the insulating adhesive is caused to flow out positively from between the protruding deformed part formed by the protrusion in the base-side terminal and the interposer-side terminal, whereby it is possible to cause the interposer-side terminal and the base-side terminal to directly abut against each other. This enables electrical connection between the base-side terminal and the interposer-side terminal to be realized with high certainty. On the other hand, the insulating adhesive remains in the gap between the non-protruding portion of the base-side terminal and the interposer-side terminal. For this reason, the adhesive bonding force of this remaining insulating adhesive enables physical connection, i.e., adhesive bonding between the interposer-side terminal and the base-side terminal to be realized with high certainty.

Incidentally, it is possible to use hot melts, epoxy-resin adhesives, acrylic adhesives, elastic adhesives and the like as the insulating adhesive.

Furthermore, it is preferred that a thermoplastic adhesive be used as the insulating adhesive and that a heater be incorporated in at least either the press anvil or the bonding head. In this case, it is possible to increase the flowability of the thermoplastic insulating adhesive by heating the thermoplastic insulating adhesive. This enables electrical connection between the base-side terminal and the interposer-side terminal to be realized with high certainty by causing the insulating adhesive to flow out with high certainty from the portion where the interposer-side terminal and the base-side terminal directly abut each other.

Furthermore, by heating the location where the protruding deformed part and the interposer-side terminal are in contact with each other, the two can be pressure bonded under heat. By performing pressure-bonding under heat, it is possible to improve the bonding condition in the location where the interposer-side terminal and the base-side terminal directly abut each other. For this reason, the electrical connection between the interposer-side terminal and the base-side terminal becomes more positive and the good connection condition can be maintained in a highly reliable condition for a long period of use.

Furthermore, it is also good to use a reactive, moisture setting adhesive, for which setting is promoted in the air, as the insulating adhesive. In this case, the setting of the insulating adhesive can be promoted during the storage or the like of the electronic component worked by the interposer bonding device, for example, in an indoor environment of a plant or a warehouse. For this reason, the bonding condition of the interposer in the electronic component can be further improved.

Moreover, it is also good to apply the insulating adhesive to the base circuit sheet so as to face the whole surface of the interposer and then to press and bond the interposer and the base circuit sheet. In this case, it is possible to improve the bonding strength of the interposer by causing the insulating adhesive to adhere to the whole surface of the interposer. Furthermore, in this case, in the press of the interposer and the base circuit sheet, an excess of the insulating adhesive flows behind the peripheral side surface of the interposer and adheres thereto.

As a result, an inclined surface formed from the insulating adhesive can be formed between the peripheral side surface of the interposer and the surface of the base circuit sheet. Because of this, the insulating adhesive adhering not only to the surface of the interposer, but also to the peripheral side surface of the interposer can bond the interposer to the base circuit sheet more strongly.

It is preferred that the bonding head apply ultrasonic wave vibrations to the interposer.

In this case, by applying ultrasonic vibrations to a location where the interposer-side terminal and the base-side terminal are in direct contact with each other, it is possible to cause the interposer-side terminal and the base-side terminal to be fusion bonded. And by this ultrasonic wave bonding, it is possible to further improve the electrical connection reliability between the interposer-side terminal and the base-side terminal and hence it is possible to further increase the durability of the electrical connection.

It is preferred that the press anvil has a substantially cylindrical shape, and is configured to hold the base circuit sheet on an outer surface thereof and to rotate around the axis center of the substantially cylindrical shape, and that the bonding head is configured to move relatively with respect to the interposer by the rotation of the press anvil.

In this case, it is possible to bond the base circuit sheet and the interposer while rotating the press anvil that holds the base circuit sheet. That is, because it is unnecessary to cause the press anvil that holds the base circuit sheet to stand still, it is possible to continuously perform working while conveying the base circuit sheet.

It is preferred that the pressing surface of the bonding head has a curved concave surface corresponding to a peripheral surface of the press anvil and is configured to be able to simultaneously press the whole surface of the base-side terminal.

In this case, it is possible to simultaneously press the whole surface of the interposer-side terminal in the process of scanning the rear surface of the interposer or the base circuit sheet and pressing the whole surface of the interposer-side terminal to the base circuit sheet. Because of this, it is possible to bond the interposer-side terminal with still higher certainty.

It is preferred that the interposer have a pair of the interposer-side terminals arranged opposite to each other, with the semiconductor chip interposed therebetween, and in that the press anvil has the convex portion in two positions spaced along the axis center, and holds the base circuit sheet with each of the convex portions facing the each base-side terminal.

In this case, there is no fear that the protrusion of the convex portion might apply excessive loads to the semiconductor chip of the interposer. For this reason, it is possible to fabricate high-quality products by suppressing initial troubles in the electronic component.

It is preferred that each of the convex portions be provided with the protrusion along the circumferential direction of the press anvil and that the protrusion be formed in such a manner that the sectional area thereof decreases toward a leading-end side of the protruding direction.

In this case, it is possible to bond the interposer-side terminal with still higher certainty thanks to the protrusion having a wedging shape.

It is preferred that in the press anvil there be provided the convex portions in a prescribed arrangement along the whole circumference of the peripheral surface thereof and that the press anvil be able to continuously perform the bonding of the plurality of the interposers.

In this case, it is possible to continuously perform the bonding of the plurality of the interposers and the electronic component can be fabricated with still higher efficiency.

It is preferred that the semiconductor chip be an IC chip for RF-ID media and that the base circuit sheet be provided with an antenna pattern that is to be electrically connected to the IC chip.

"RF-ID" is an abbreviation of Radio-Frequency Identification. And excellent-quality products having high reliability can be manufactured with very good efficiency when RF-ID media are fabricated by using the interposer bonding device of the present invention. Because in particular RF-ID media require cost reductions, the advantage of the interposer bonding device of the present invention is particularly beneficial for the media in that the interposer bonding device provides improved production efficiency. Incidentally, it is also possible to fabricate ID media for contact ID by using the interposer bonding device of the present invention.

Embodiment 1

This embodiment relates to an interposer bonding device 3 for fabricating an electronic component 1 in which an interposer 10 is bonded to a base circuit sheet 20. This embodiment will be described with reference to FIGS. 1 to 9.

Figure 2:
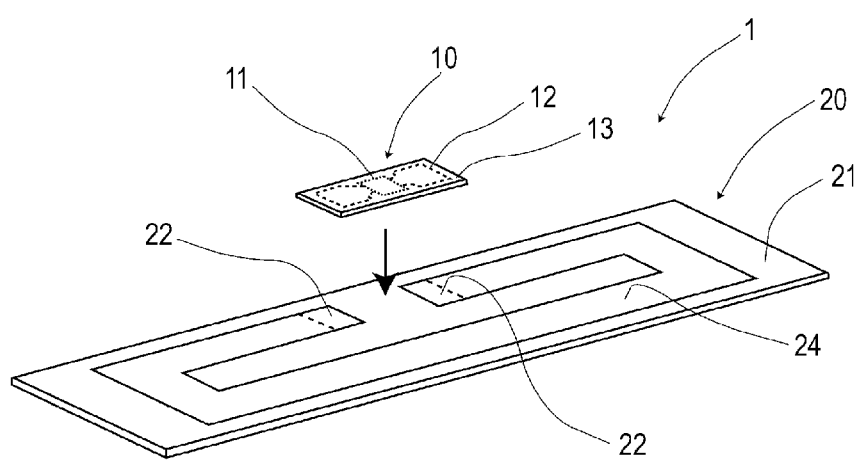
FIG. 2 is a perspective view of an RF-ID medium in Embodiment 1.

As shown in FIGS. 1 and 2, the interposer bonding device 3 of this embodiment is intended for bonding an interposer 10 in which a semiconductor chip 11 is mounted on a sheet-like chip holding member 13 and which has an interposer-side terminal 12, which is a connection terminal provided in an extending manner from the semiconductor chip 11, to a base circuit sheet 20 that is formed from a sheet-like base member 21 and is provided, on a surface thereof, with a base-side terminal 22.

This interposer bonding device 3 has a press anvil 31 that holds the base circuit sheet 20 on which the interposer 10 is laminated, with the interposer-side terminal 12 and the base-side terminal 22 facing each other, and a bonding head 32 that moves relatively with respect to the press anvil 31.

The bonding head 32 has a pressing surface 320 that is formed so as to abut against a rear surface of the interposer 10. This pressing surface 320 scans the rear surface of the interposer 10 according to the relative movement of the bonding head 32 to the press anvil 31 and presses at least the whole surface of the interposer-side terminal 12 to the base circuit sheet 20.

This interposer bonding device will be described in detail below.

First, as shown in FIG. 2, the electronic component 1 fabricated in this embodiment is an RF-ID (Radio-Frequency Identification) medium for noncontact ID (hereinafter described as an RF-ID medium 1, as required). This RF-ID medium 1 is obtained by laminating and bonding an interposer 10, on which an IC chip for RF-ID (hereinafter described as an IC chip 11, as required) as the semiconductor chip 11 is mounted, to an antenna sheet (hereinafter described as an antenna sheet 20, as required) that is provided with an antenna pattern 24 as the base circuit sheet 20.

As shown in FIG. 2, the interposer 10 is such that the IC chip 11 is mounted on a surface of the chip holding member 13 in the form of a 200 μm thick sheet formed from PSF. On the surface of this chip holding member 13, there are provided an electrically conductive pad (not shown) that is to be electrically connected to an electrode pad (not shown) of the IC chip 11 and the interposer-side terminal 12 that is provided in an extending manner from this electrically conductive pad. Incidentally, in this embodiment, the electrically conductive pad and the interposer-side terminal 12 were formed from an electrically conductive ink.

Incidentally, as the material for the chip holding member 13, PC, coated paper and the like can be adopted in addition to the PSF of this embodiment. In order to protect the electrical connections between the electrically conductive pad and the electrode pad, it is also advisable to use an underfill material, a potting material and the like. As the method for forming the interposer-side terminal 12 and the like of the chip holding member 13, it is also good to adopt methods, such as copper etching, dispensing, metal foil sticking, direct vapor deposition of a metal, transfer of a vapor deposited metal film and formation of an electrically conductive polymer layer in place of the method of printing an electrically conductive ink in this embodiment.

As shown in FIG. 2, the antenna sheet 20 is such that the antenna pattern 24 formed from an electrically conductive ink is provided on a surface of the 100 μm thick thermoplastic base member 21 formed from PET. This antenna pattern 24 has a substantially annular shape that is discontinuous in one place. And in the antenna pattern 24, at both ends that form this one place are provided base-side terminals 22 that connect electrically to the interposer-side terminal 12.

Incidentally, as in the interposer-side terminal 12 formed in the chip holding member 13, it is also possible to adopt an antenna pattern 24 formed by methods, such as copper etching, dispensing, metal foil sticking, direct vapor deposition of a metal, transfer of a vapor deposited metal film and formation of an electrically conductive polymer layer in place of an antenna pattern 24 formed from an electrically conductive ink. As the material for the base member 21, PET-G, PC, PP, nylon, paper and the like can be used in addition to the PET of this embodiment. Furthermore, as the ink material for the electrically conductive ink, it is possible to use silver, graphite, silver chloride, copper, nickel and the like.

Figure 3:
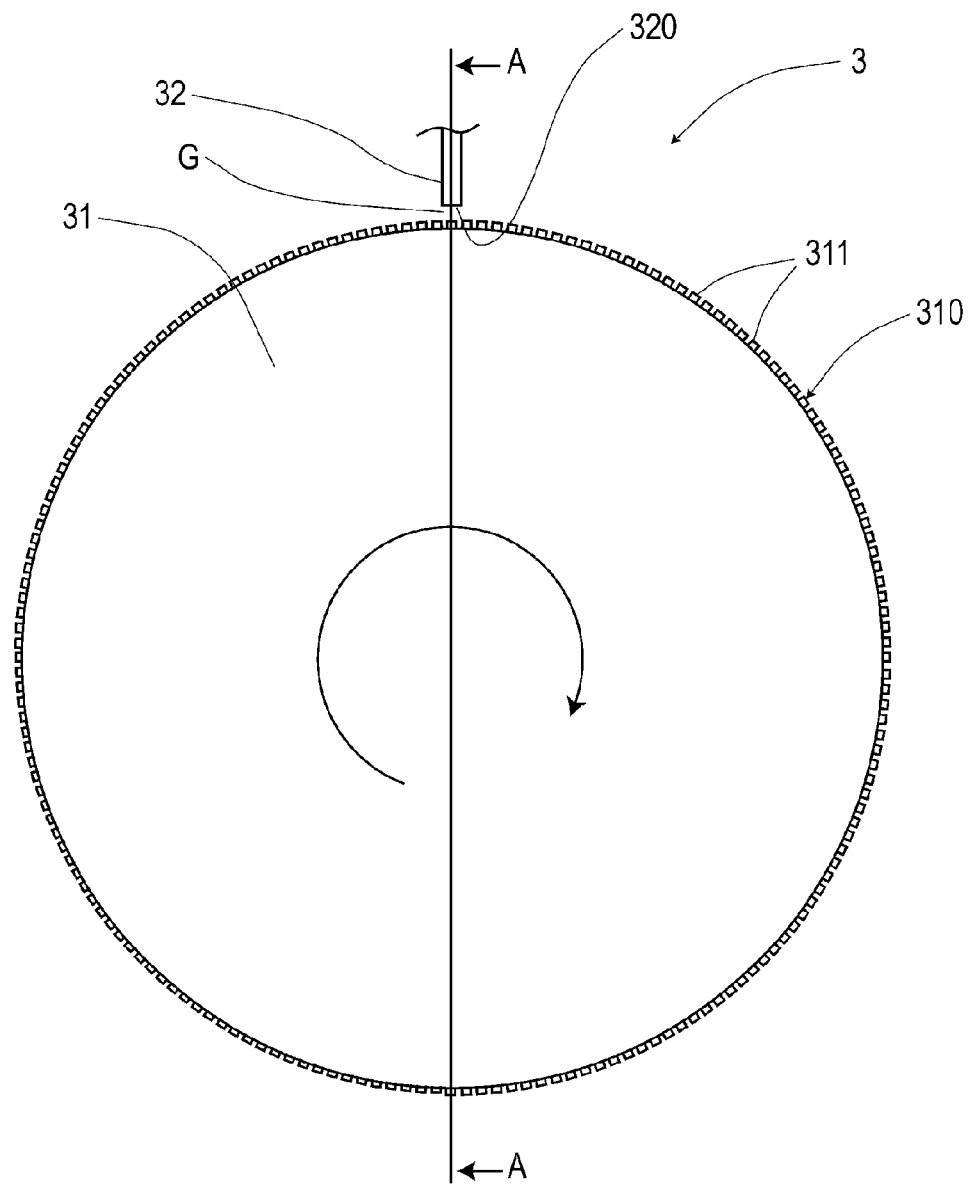
FIG. 3 is a side view of an interposer bonding device in Embodiment 1.
Figure 4:
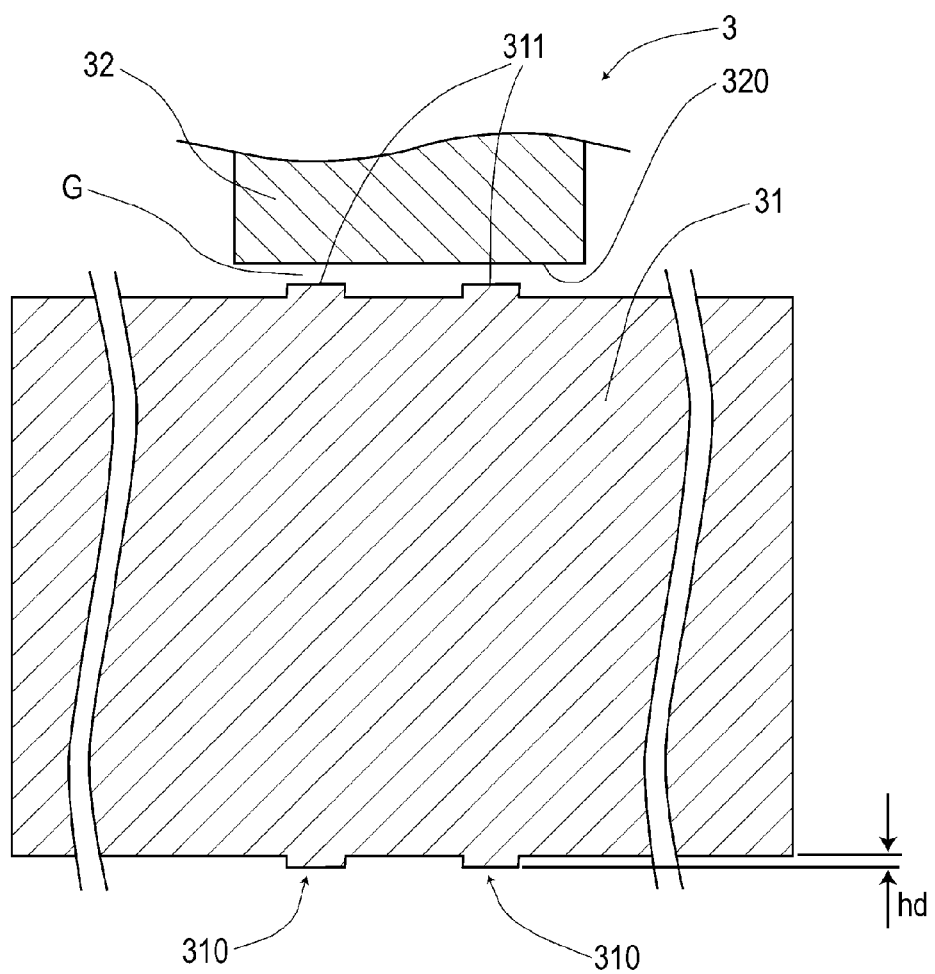
FIG. 4 is a sectional view of an interposer bonding device in Embodiment 1 (a sectional view taken in the direction of the arrows A-A in FIG. 3)

Next, the interposer bonding device 3 of this embodiment will be described. As shown in FIGS. 3 and 4, the interposer bonding device 3 of this embodiment is constituted by the press anvil 31 in the shape of a substantially cylindrical roller and the bonding head 32 having the pressing surface 320 facing the outer surface of the press anvil 31 with a prescribed gap G.

As shown in FIGS. 1, 3 and 4, the press anvil 31 is constructed so as to hold a continuous antenna sheet 200 in continuous sheet form in which the interposer 10 is arranged on an outer surface of the substantially cylindrical roller. This continuous antenna sheet 200 is formed from a base member 21 in continuous sheet form and is continuously provided, on a surface thereof, with the antenna pattern 24. The interposer bonding device 3 of this embodiment continuously performs the bonding of the interposer 10 by supplying the continuous antenna sheet 200 in which the interposer 10 is arranged for each of the antenna patterns 24.

Figure 9:
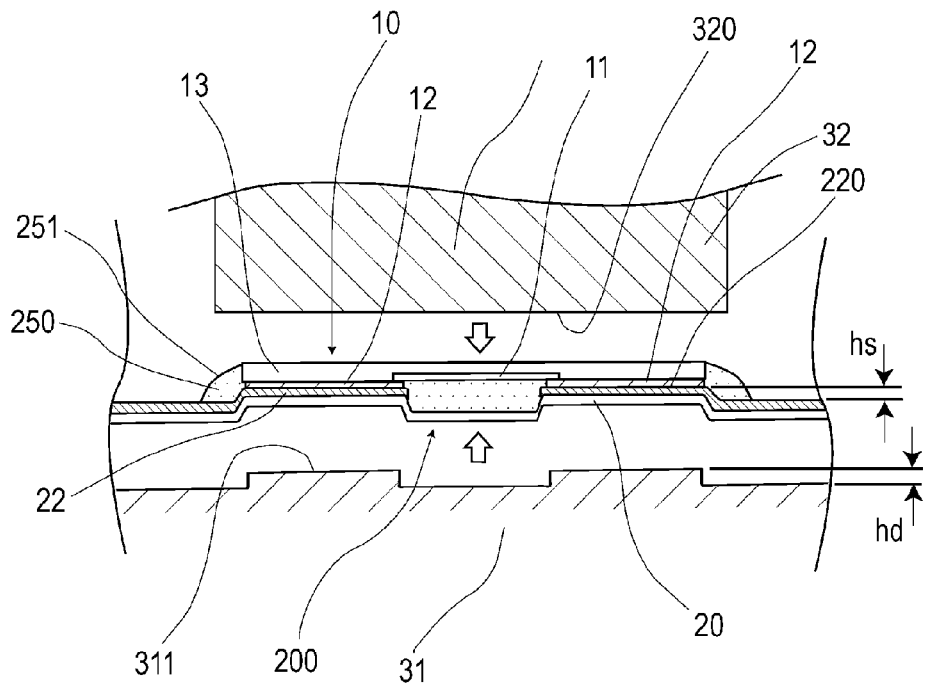
FIG. 9 is a sectional view that shows the sectional structure after the bonding step in Embodiment 1 (a sectional view including the axis center of a press anvil)

As shown in FIGS. 1, 3, 4 and 7, the press anvil 31 holds the continuous antenna sheet 200 so that a pair of base-side terminals 22 is arranged along the direction of the axis center. On the peripheral surface of the press anvil 31, there are provided convex portions 310 in two rows corresponding to each of the base-side terminals 22. The convex portion 310 forms a substantially annular shape provided in an extending manner along the whole circumference of the press anvil 31. As shown in FIG. 9, each of the convex portions 310 is provided so as to face the base-side terminals 22 of the continuous antenna sheet 200.

As shown in FIGS. 3 and 4, the convex portion 310 is continuously provided with ridge-like protrusions 311 that are provided in an extending manner to be substantially parallel to the direction of the axis center. Each of the protrusions 311 protrudes toward the peripheral side of the press anvil 31. In this embodiment, the formation pitch of the protrusions 311 is set so that several protrusions 311 face each of the base-side terminals 22 (see FIG. 8). In this embodiment, the protruding height hd of the protrusion 311 is 400 μm.

Furthermore, the press anvil 31 of this embodiment has an unillustrated heater. The press anvil 31 can heat each of the protrusions 311 by the heat coming from this heater. And in the interposer bonding device 3 of this embodiment, the continuous antenna sheet 200 is pressed by the heated protrusion 311. Because of this, the continuous base member 21 formed from a thermoplastic material that constitutes the continuous antenna sheet 200 is caused to protrude and deformed easily with high shape accuracy.

As shown in FIGS. 3 and 4, the bonding head 32 faces the outermost peripheral surface of the press anvil 31 formed by the protruding surface of each of the protrusions 311 thereof with a gap G of 230 μm as described above. Furthermore, the bonding head 32 of this embodiment has an unillustrated vibration applying unit. This vibration applying unit applies ultrasonic wave vibrations to the pressing surface 320 of the bonding head 32. Incidentally, in the case of this embodiment, it is advisable to set the above-described gap G at 220 to 250 μm.

Incidentally, the pressing surface 320 is subjected to diamond coat treatment, which is surface treatment, in order to suppress the friction with the rear surface of the interposer 10. In place of this treatment, it is also effective to subject the pressing surface to surface treatment, such as Teflon (r) coat, and to dispose a hard metal chip made of tungsten carbide on the pressing surface 320. Or alternatively, it is also advisable to provide a rotating roller at the leading end of the bonding head 32, whereby the peripheral surface of this rotating roller is used as the pressing surface.

Figure 5:
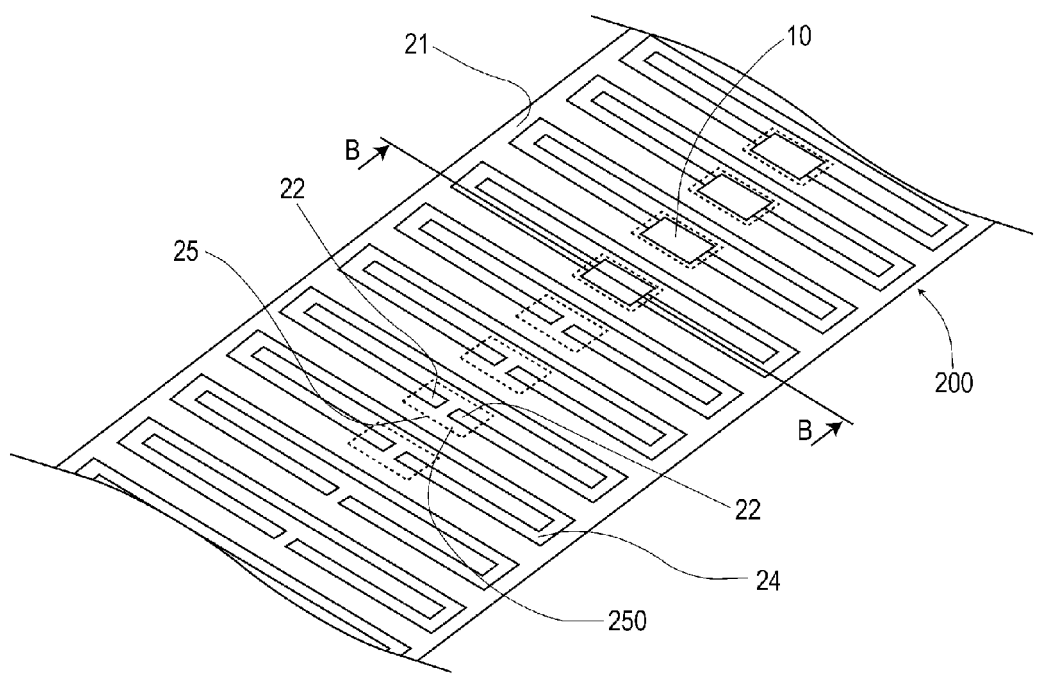
FIG. 5 is a perspective view of a continuous antenna sheet in Embodiment 1.

Next, a description will be given of the procedure for manufacturing the RF-ID medium 1 performed by using the interposer bonding device 3 of this embodiment. In fabricating the RF-ID medium 1 in which the interposer 10 is bonded to the antenna sheet 20, as shown in FIG. 5, first, the continuous antenna sheet 200 is prepared by forming the antenna pattern 24 on the surface of the base member 21 in continuous sheet form. With the continuous antenna sheet 200, there are performed an adhesive application step for providing an adhesive-disposed layer 25 of an insulating adhesive 250 having electrical insulating properties on the surface of the base-side terminal 22, an interposer arranging step for arranging the interposer 10, and a bonding step for bonding the interposer 10 by using the interposer bonding device 3. And after that, individual RF-ID media 1 are cut out of the continuous antenna sheet 200 to which the interposer 10 is bonded.

In the adhesive application step, as shown in FIG. 5, the adhesive-disposed layer 25 was provided on the surface of the continuous antenna sheet 200 by applying the insulating adhesive 250 to a region including the pair of base-side terminals 22. In this embodiment, the adhesive-disposed layer 25 having a thickness of 40 to 80 μm was provided so as to include the arrangement region of the interposer 10. Incidentally, in this embodiment, a thermoplastic, moisture setting hot melt (Model No. TE-031 made by 3M) was used as the insulating adhesive 250.

Incidentally, it is possible to use epoxy-resin adhesives, acrylic adhesives, elastic adhesives, urethane-resin adhesives and the like as the insulating adhesive 250 in addition to the above-described hot melt. Moreover, in place of the moisture setting insulating adhesive 250, it is also possible to use reactive adhesives, such as thermosetting, ultraviolet ray setting and electron beam setting adhesives.

Figure 6:
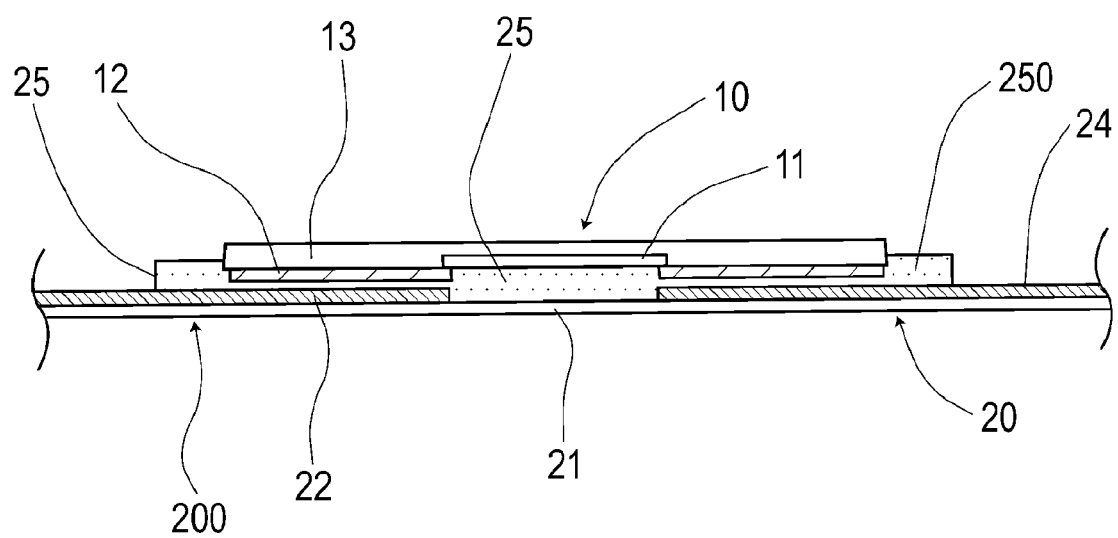
FIG. 6 is a sectional view that shows the sectional construction of a continuous antenna sheet in which an interposer is arranged in Embodiment 1 (a sectional view taken in the direction of the arrows B-B in FIG. 5)

Next, in the interposer arranging step, as shown in FIGS. 5 and 6, the interposer 10 is arranged on the surface of the continuous antenna sheet 200 so that the base-side terminal 22 and the interposer-side terminal 12 face each other. As described above, in this embodiment, the adhesive-disposed layer 25 is provided so as to include the arrangement region of the interposer 10. For this reason, the interposer 10 faces the antenna sheet 20 with the insulating adhesive layer 25 in between over the surface of the interposer 10.

Figure 7:
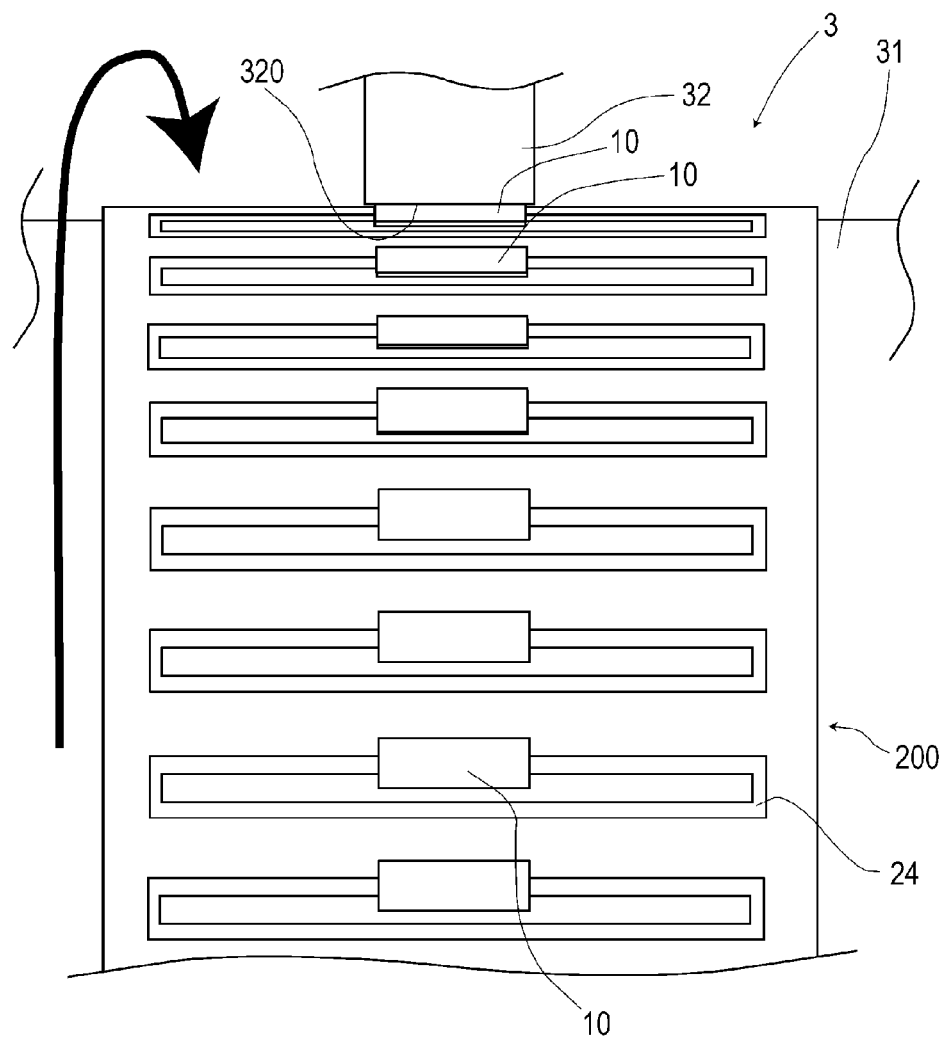
FIG. 7 is an explanatory diagram to explain how a continuous antenna sheet is supplied to an interposer bonding device in Embodiment 1.
Figure 8:
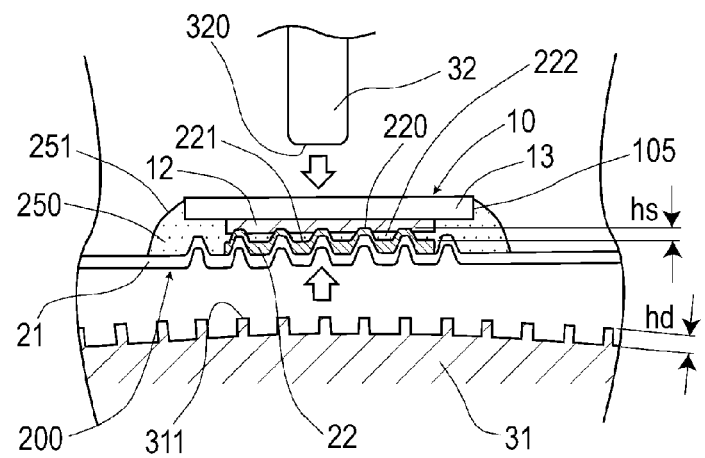
FIG. 8 is a sectional view that shows a sectional structure after the bonding step in Embodiment 1 (a sectional view orthogonal to the axis center of a press anvil)

Next, as shown in FIGS. 7 to 9, there is performed the bonding step that involves pressing the interposer 10 toward the continuous antenna sheet 200 and bonding the interposer 10 thereto by using the interposer bonding device 3 of this embodiment. As described above, the press anvil 31 of the interposer bonding device 3 has the continuously provided, ridge-like protrusions 311 so as to face the rear surface of each of the base-side terminals 22. And with the protrusions 311 of this embodiment having a protruding height hd of 400 μm, it is possible to form a protruding deformed portion 220 having a protruding height hs of about 100 μm in the base-side terminal 22.

Incidentally, it is advisable that the protruding height hd of the protrusion 311 be 100 to 800 μm. In this case, it is possible to cause the insulating adhesive 250 that may flow out from between the interposer 10 and the continuous antenna sheet 200 to be discharged from the gap between adjacent protrusions 311.

And in this embodiment, the press anvil 31 in which the surface temperature of the pressing surface was maintained at 200 was rotated and the interposer 10 held by the press anvil 31 via the continuous antenna sheet 200 was continuously conveyed toward the gap G formed between the bonding head 32 and the press anvil 31. As described above, in this embodiment, the gap G between the press anvil 31 and the bonding head 32 is set at 230 μm for the combination of the 100 μm thick base member 21 that forms the continuous antenna sheet 200 and the 200 μm thick chip holding member 13 that forms the interposer 10.

For this reason, when the interposer 10 arranged on the surface of the continuous antenna sheet 200 passes the above-described gap G, the interposer 10 can be pressed to the continuous antenna sheet 200. The interposer bonding device 3 of this embodiment strongly bonds the interposer 10 by using the pressing force generated here.

With the interposer bonding device 3 of this embodiment having the combination of the press anvil 31 provided with the convex portion 310 and the bonding head 32, it is possible to cause part of each of the base-side terminals 22 in the antenna sheet 20 to protrude and be deformed by the protrusion 311. That is, as shown in FIGS. 8 and 9, it is possible to form the ridge-like protruding deformed portion 220 in each of the base-side terminals 22 deformed by the protrusions 311 provided in the form of a ridge on the pressing surface of the press anvil 31. The base-side terminal 22 and the interposer-side terminal 12 come into direct contact with each other via this ridge-like protruding deformed portion 220, and a gap 222 between the two is formed corresponding to portions other than this protruding deformed portion 220.

For this reason, between this protruding deformed portion 220 and the interposer-side terminal 12, the insulating adhesive 250 flows out and the protruding deformed portion 220 is pressure bonded to the interposer-side terminal 12. As a result of this, it is possible to realize electrical connection between the interposer-side terminal 12 and the base-side terminal 22 with high certainty. On the other hand, in the gap 222 between a non-protruding portion 221 other than the protruding deformed portion 220 in each of the base-side terminals 22 and the facing interposer-side terminal 12, the insulating adhesive 250 does not flow out completely, and an appropriate amount of the insulating adhesive 250 remains as it is. Therefore, the adhesive bonding, i.e., physical connection between the interposer-side terminal 12 and the base-side terminal 22 is realized with high certainty via this insulating adhesive 250 remaining in the gap 222.

Furthermore, in this embodiment, the adhesive-disposed layer 25 was provided in a region including the arrangement region of the interposer 10. Because of this, the interposer 10 faces the continuous antenna sheet 200 via the insulating adhesive 250 almost all over the surface of the interposer 10. As a result, the interposer 10 is strongly bonded to the continuous antenna sheet 200.

Moreover, by pressing the interposer 10 and the antenna sheet 20 abutted against each other, an excess of the insulating adhesive 250 flows behind the peripheral side surface of the interposer 10 and adheres thereto. As a result, an inclined surface 251 formed from the insulating adhesive 250 is formed between the peripheral side surface of the interposer 10 and the continuous antenna sheet 200. As a result, not only the surface of the interposer 10, but also the peripheral side surface 105 of the interposer 10 becomes adhesive surfaces. Therefore, the interposer 10 becomes bonded very strongly to the continuous antenna sheet 200.

Furthermore, in the interposer bonding device 3 of this embodiment, the press anvil 31 that abuts against the base member 21 formed from a thermoplastic material is provided with the heater. By performing the bonding step while heating the continuous antenna sheet 200 by use of this press anvil 31, it is possible to form the protruding deformed portion 220 with good efficiency and with good shape accuracy by the protrusion 311 of the press anvil 31. And it is possible to perform the pressure-bonding of the protruding deformed portion 220 under heat to the interposer-side terminal 12 and electrical connection reliability can be improved.

The insulating adhesive 250 used in this embodiment has thermal plasticity. Because of this, the flowability of the insulating adhesive 250 can be increased by heating the insulating adhesive 250 by use of the heater. For this reason, the insulating adhesive 250 is caused to flow from between the protruding deformed portion 220 in the base-side terminal 22 and the interposer-side terminal 12 with high certainty, and it is possible to realize electrical contact between the two with high certainty.

Moreover, as described above, the interposer bonding device 3 is provided with the vibration applying unit for applying ultrasonic waves to the bonding head 32. Because of this, in a location where the interposer-side terminal 12 and the base-side terminal 22 come into direct contact with each other, the two can be fusion bonded by ultrasonic wave bonding and the electrical connection reliability can be further improved. By bonding the interposer-side terminal 12 and the base-side terminal 22 by a combination of the pressure-bonding under heat and the fusion bonding by ultrasonic wave bonding, it is possible to maintain the excellent electrical connection condition between the two with high stability in a long period of use of the RF-ID medium 1.

Furthermore, the insulating adhesive 250 used in this embodiment is a moisture setting, reactive type. Because of this, after the bonding step is performed, it is possible to bring the bonding condition of the interposer 10 into a state close to perfection during a storage of RF-ID medium 1 prepared.

For the shape of the protrusion 311 provided on the pressing surface of the press anvil 31, it is also possible to form protrusions 311 of various shapes, such as block-like, scattered-point-like, cruciform and comb-shaped protrusions in place of the ridge-like shape of this embodiment. Furthermore, substantially annular protrusions 311 that are disposed parallel in the direction of the axis center and provided in an extending manner on the peripheral surface of the press anvil 31 in the circumferential direction of the press anvil 31 may be used for the convex portion 310.

Figure 10:
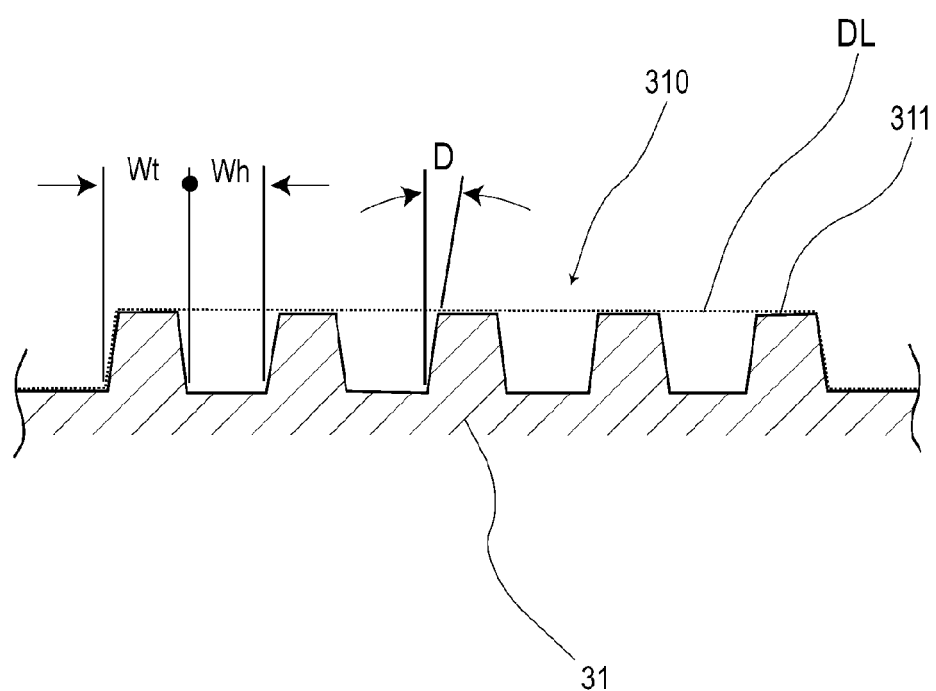
FIG. 10 is a sectional view that shows other protrusions in Embodiment 1.

For example, as shown in FIG. 10, five block-like protruding shapes arranged at substantially equal intervals on one line can be provided in place of one ridge-like protrusion 311 of this embodiment (the shape is indicated by the symbol DL) as a block-like protruding portion 311. In this case, these protruding shapes form individual protrusions 311. At this time, for the arrangement shape of the convex portion 310 formed by all of these protrusions 311, it is possible to adopt almost the same shape as with the convex portion 310 of this embodiment (see FIGS. 3 and 4). Incidentally, as the sectional shape of each of the protrusions 311, it is possible to adopt, for example, a sectional shape that is a square 400 μm (indicated by Wt in the figure)×400 μm. In the convex portion 310, it is possible to set the gap Wh between adjacent protrusions 311 at 400 μm. As the protruding inclination angle D of each of the protrusions 311, it is advisable to set 5 degrees to 15 degrees.

Moreover, in this embodiment, the adhesive-disposed layer 25 was provided so as to include the arrangement region of the interposer 10. In place of this, it is also possible to provide the adhesive-disposed layer 25 in a region that is smaller than the arrangement region of the interposer 10 and is limited to the peripheral portion of the arrangement region of the interposer 10. Furthermore, it is also possible to form the adhesive-disposed layer 25 in a manner corresponding to each of the base-side terminals 22 and independently of each other.

The bonding method of the interposer 10 of this embodiment is not limited to the manufacture of the RF-ID medium 1 and is effective in the fabrication of various kinds of electronic components in which the interposer 10 is used. For example, the bonding method of the interposer 10 of this embodiment can be used in the manufacturing process of various electronic components, such as FPCs (flexible printed circuit boards), paper computers and disposable electronic appliances.

Embodiment 2

In this embodiment, mainly the shapes of the pressing surface 320 of the bonding head 32 and the convex portion 310 of the press anvil 31 are changed on the basis of the interposer bonding device 3 of Embodiment 1. This embodiment will be described with reference to FIGS. 11 to 16.

Figure 11:
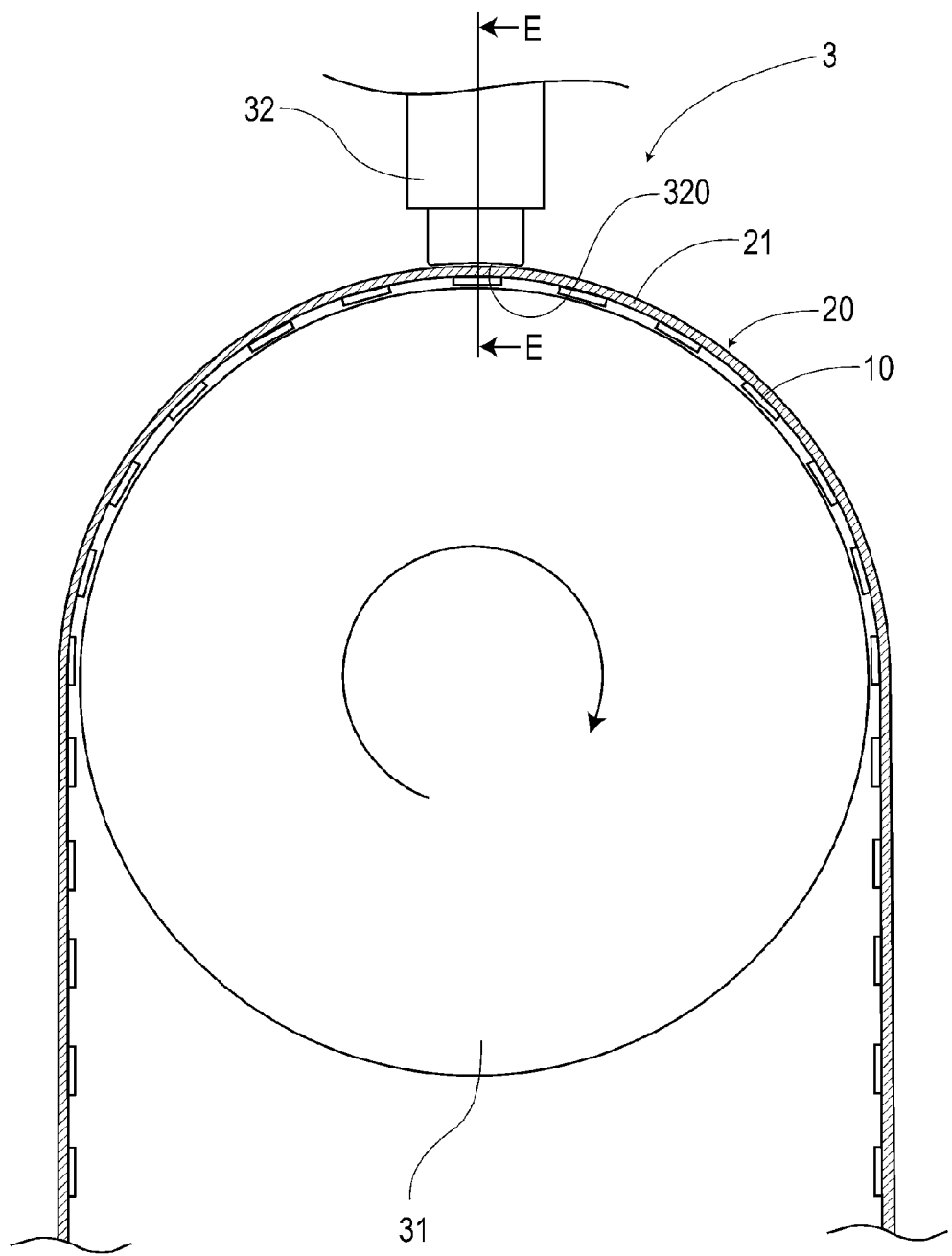
FIG. 11 is a side view of an interposer bonding device in Embodiment 2.

In the interposer bonding device 3 of this embodiment, as shown in FIG. 11, the bonding head 32 abuts against the antenna sheet 20 and the press anvil 31 abuts against interposer 10.

Figure 12:
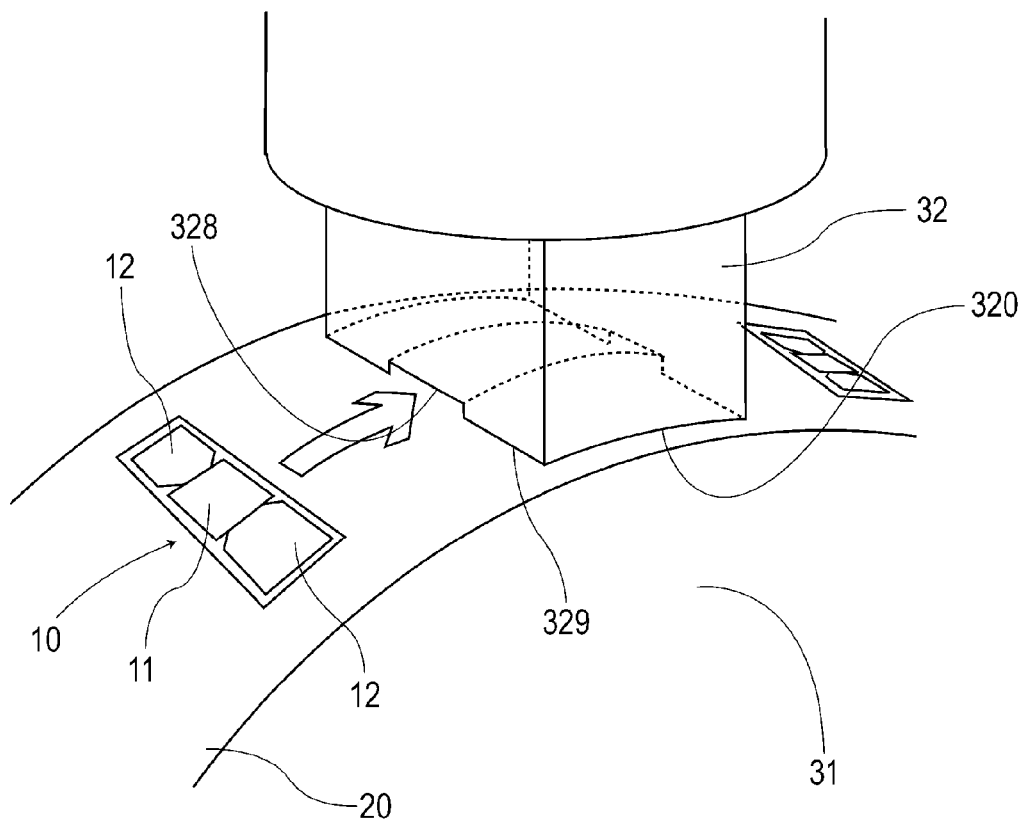
FIG. 12 is a perspective view including an area pressed by a bonding head in Embodiment 2.

As shown in FIGS. 11 and 12, the bonding head 32 of this embodiment has a pressing surface 320 that is formed so as to correspond to the curved peripheral surface of the press anvil 31. This pressing surface 320 is such that the size thereof which is coincident with the circumferential direction of the press anvil 31 is wider than the interposer 10. Because of this, in the interposer bonding device 3 of this embodiment, it is possible to simultaneously press the whole surface of the interposer-side terminal 12 by use of the pressing surface 320 for a prescribed time while the interposer 10 is conveyed by the press anvil 31.

As shown in FIG. 12, a concavity 328 arranged in a manner extending in the circumferential direction is provided in a substantially middle part of the pressing surface 320 coincident with the axial direction of the press anvil 31. Because of this, with the pressing surface 320, there is little fear that excessive loads may act on the IC chip 11 of the interposer 10. Incidentally, it is preferred that the rectangular shape of an edge portion 329 of the pressing surface 320 on the upstream side of the rotation of the press anvil 31 be formed to have a convex surface. In this case, it is possible to smoothly convey the interposer 10 and the antenna sheet 20 to the pressing surface 320.

Figure 13:
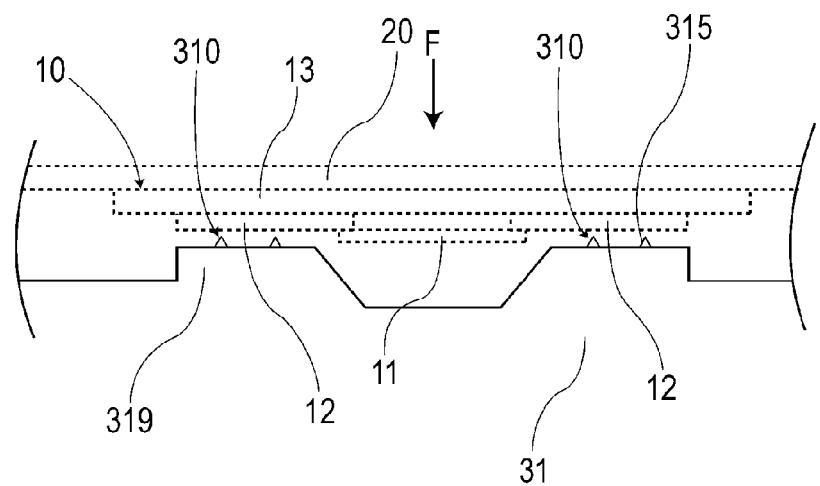
FIG. 13 is a sectional view that shows the section of a press anvil in Embodiment 2 (a sectional view taken in the direction of the arrows E-E in FIG. 11)
Figure 14:
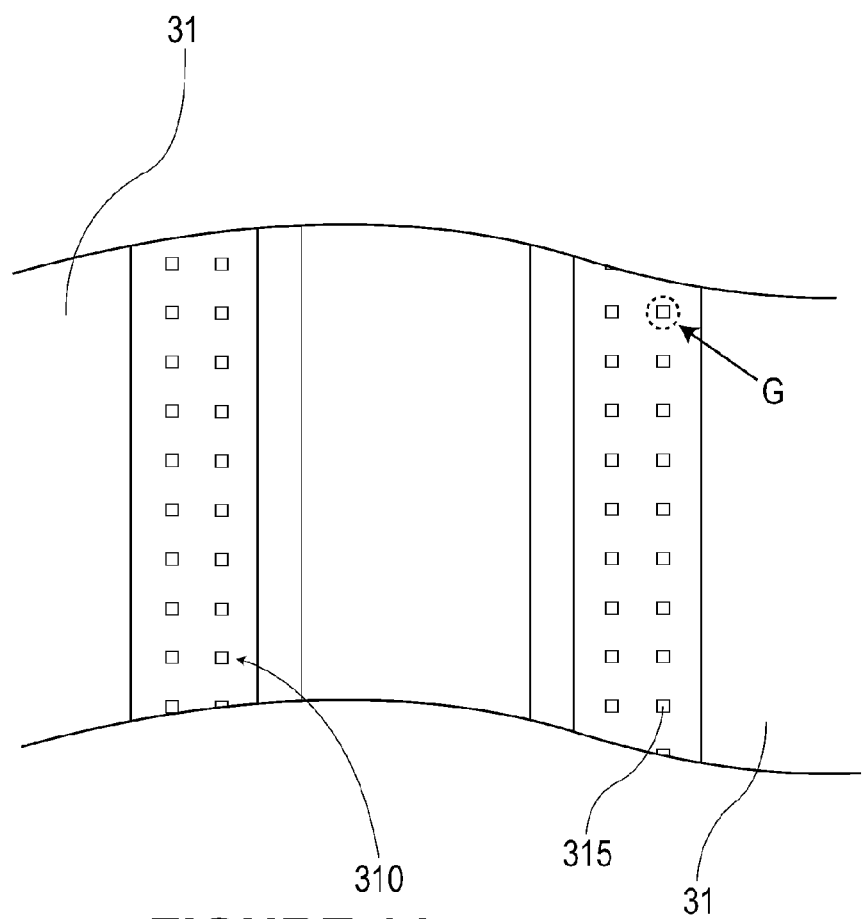
FIG. 14 is a front view that shows the peripheral surface of a press anvil in Embodiment 2 (a view taken in the direction of the arrow F in FIG. 13)
Figure 15:
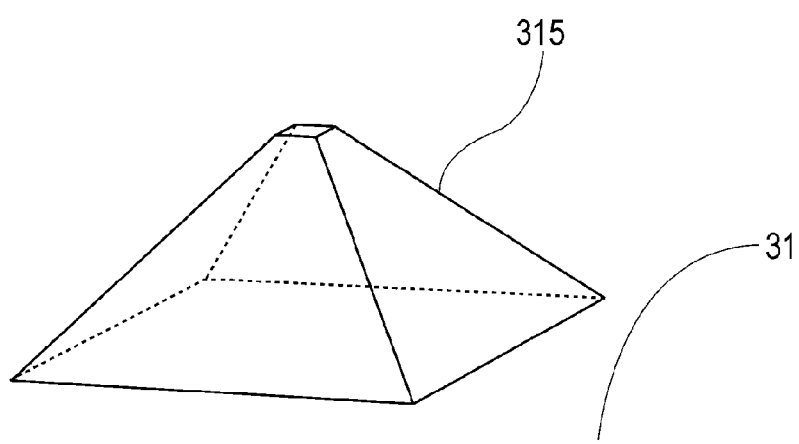
FIG. 15 is a perspective view of a protrusion in Embodiment 2 (a view taken in the direction of the arrow G in FIG. 14)

As shown in FIGS. 13 to 15, each of the convex portion 310 of the press anvil 31 in this embodiment is formed on the peripheral surface of a pedestal portion 319, whose diameter is larger than other portions and which is provided in a manner extending along the circumferential direction. Each of the convex portions 310 has protrusions arranged in two rows along the circumferential direction. Incidentally, in FIG. 13, the bonding head 32 is omitted and the antenna sheet 20 and the interposer 10 are indicated by broken lines.

As shown in FIG. 15, the protrusion 315 of this embodiment is in the shape of a substantially quadrangular pyramid having a plane part at the leading end thereof. As the shape of the protrusion 315, it is possible to adopt various shapes, such as a triangular pyramid and a cone, in addition to the quadrangular pyramid of this embodiment.

Figure 16:
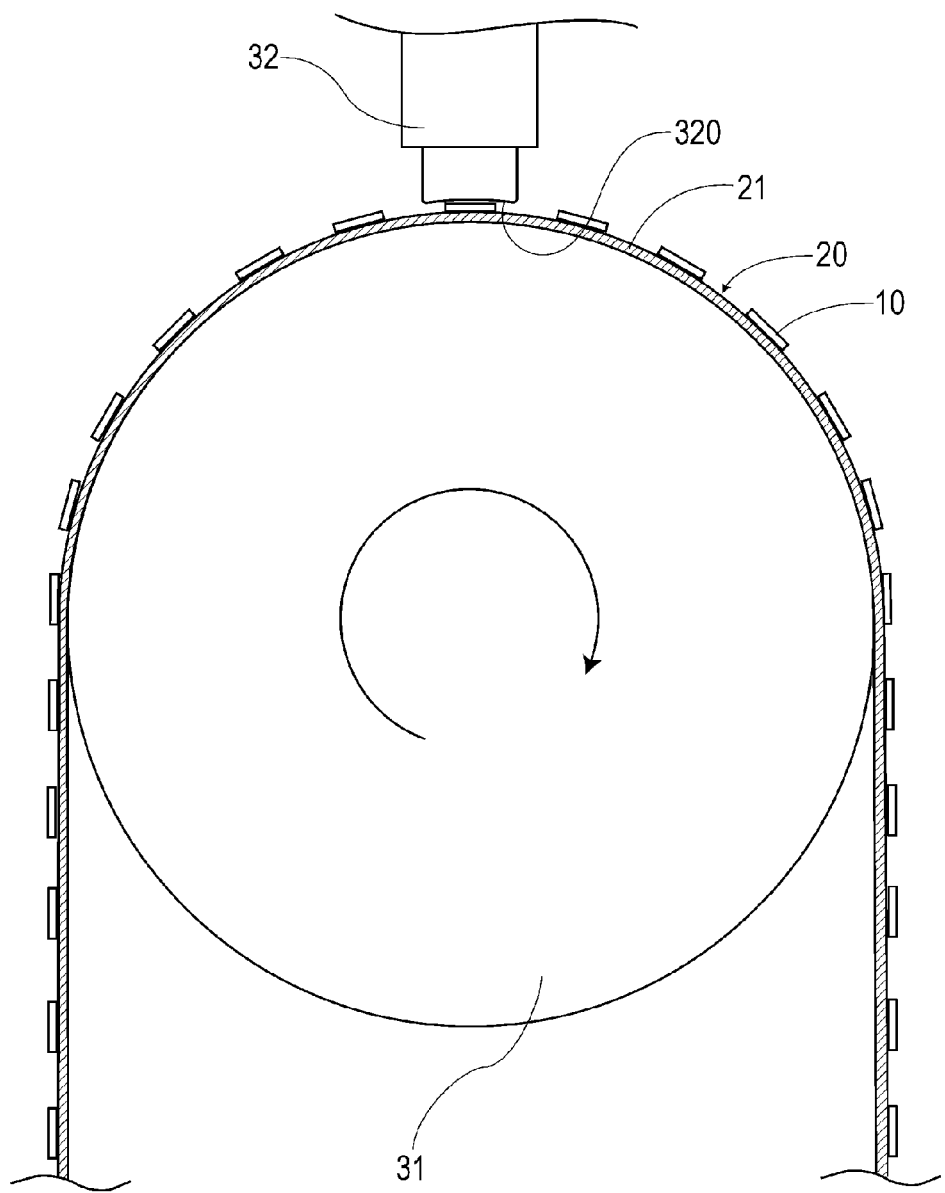
FIG. 16 is a side view of another interposer bonding device in Embodiment 2.

Incidentally, in the interposer bonding device 3 of this embodiment, as shown in FIG. 16, it is also possible to bond the interposer 10, with the interposer 10 abutting against the bonding head 32 and the antenna sheet 20 abutting against the press anvil 31.

The invention claimed is:

1. An interposer bonding device for bonding an interposer to a base circuit sheet, the interposer having a semiconductor chip mounted on a sheet chip holding member and having an interposer-side terminal as a connection terminal extending from the semiconductor chip, the base circuit sheet formed from a sheet base member and provided with a base-side terminal on a surface thereof, the interposer bonding device comprising:

a press anvil configured to hold the base circuit sheet and provided with a pressing surface that has a convex portion including a protrusion that protrudes toward the held base circuit sheet; and a bonding head provided with a pressing surface configured to press a surface of a sheet material by pressing against the surface, wherein, when supplying the base circuit sheet on which the interposer is laminated, in a configuration where the interposer-side terminal and the base-side terminal are facing each other with an adhesive having electrical insulating properties, the pressing surface is configured to scan a rear surface of the interposer according to the relative movement of the bonding head to the press anvil and to press the interposer-side terminal to the base-side terminal, wherein the protrusion is configured to shape part of the base-side terminal to form a protruding deformed portion that contacts directly with the interposer-side terminal, and a gap between both terminals with the adhesive remaining therein, corresponding to portions other than the protruding deformed portion in the base-side terminal, wherein the press anvil has a substantially cylindrical shape and is configured to hold, on an outer surface thereof, the base circuit sheet and to rotate around an axis center of the substantially cylindrical shape, and wherein the bonding head is configured to move relative to the interposer by the rotation of the press anvil.

2. The interposer bonding device according to claim 1, wherein the pressing surface of the bonding head has a curved concave surface corresponding to a peripheral surface of the press anvil.

3. The interposer bonding device according to claim 1, wherein the interposer has a pair of interposer-side terminals arranged opposite to each other, with the semiconductor chip interposed there-between, wherein the base circuit sheet has a pair of base-side terminals corresponding to the pair of the interposer-side terminals, and wherein the press anvil has the convex portion in two positions spaced along the axis center, and is configured to hold the base circuit sheet with each of the convex portions facing a rear of each base-side terminal.

4. The interposer bonding device according to claim 1, wherein the convex portions is provided with a plurality of protrusions corresponding to one base-side terminal along a circumferential direction of the press anvil.

5. The interposer bonding device according to claim 1, wherein the press anvil includes the convex portions in a predetermined arrangement along a whole circumference of a peripheral surface thereof and the press anvil is configured to continuously perform the bonding of a plurality of the interposers.

6. An interposer bonding device for bonding an interposer to a base circuit sheet, the interposer having a semiconductor chip mounted on a sheet chip holding member and having an interposer-side terminal as a connection terminal extending from the semiconductor chip, the base circuit sheet formed from a sheet base member and provided with a base-side terminal on a surface thereof, the interposer bonding device comprising:

a press anvil configured to hold the base circuit sheet and provided with a pressing surface that has a convex portion including a protrusion that protrudes toward the held base circuit sheet; and a bonding head provided with a pressing surface configured to press a surface of a sheet material by Pressing against the surface, wherein, when supplying the base circuit sheet on which the interposer is laminated, in a configuration where the interposer-side terminal and the base-side terminal are facing each other with an adhesive having electrical insulating properties, the pressing surface is configured to scan the rear surface of the base circuit sheet according to the relative movement of the bonding head to the press anvil and to press the base-side terminal to the interposer-side terminal, wherein the protrusion is configured to shape part of the interposer-side terminal to form a protruding deformed portion that contacts directly with the base-side terminal, and a gap between both terminals with the adhesive remaining therein, corresponding to portions other than the protruding deformed portion in the interposer-side terminal, wherein the press anvil has a substantially cylindrical shape and is configured to hold, on an outer surface thereof, the base circuit sheet and to rotate around an axis center of the substantially cylindrical shape, and wherein the bonding head is configured to move relative to the base circuit sheet by the rotation of the press anvil.

7. The interposer bonding device according to claim 6, wherein the pressing surface of the bonding head has a curved concave surface corresponding to a peripheral surface of the press anvil.

8. The interposer bonding device according to claim 6, wherein the interposer has a pair of interposer-side terminals arranged opposite to each other, with the semiconductor chip interposed there-between, and wherein the press anvil has the convex portion in two positions spaced along the axis center, and is configured to hold the base circuit sheet with each of the convex portions facing the rear of each interposer-side terminal.

9. The interposer bonding device according to claim 6, wherein the convex portion is provided with a plurality of protrusions corresponding to one interposer-side circuit along the circumferential direction of the press anvil.

10. The interposer bonding device according to claim 6, wherein the press anvil includes the convex portion in a predetermined arrangement along a whole circumference of a peripheral surface thereof and the press anvil is configured to continuously perform the bonding of a plurality of the interposers.

* * * * *